(12) United States Patent
Lim

(10) Patent No.: US 12,027,304 B2
(45) Date of Patent: Jul. 2, 2024

(54) STACKED COMMON MODE FILTER

(71) Applicant: AMOTECH CO., LTD., Incheon (KR)

(72) Inventor: Byungguk Lim, Incheon (KR)

(73) Assignee: AMOTECH CO., LTD., Incheon (KR)

(*) Notice: Subject to any disclaimer, the term of this patent is extended or adjusted under 35 U.S.C. 154(b) by 0 days.

(21) Appl. No.: 17/768,196

(22) PCT Filed: Sep. 24, 2020

(86) PCT No.: PCT/KR2020/012975
§ 371 (c)(1),
(2) Date: Apr. 11, 2022

(87) PCT Pub. No.: WO2021/071144
PCT Pub. Date: Apr. 15, 2021

(65) Prior Publication Data
US 2024/0087801 A1 Mar. 14, 2024

(30) Foreign Application Priority Data

Oct. 11, 2019 (KR) ........................ 10-2019-0126525

(51) Int. Cl.
| H01F 27/36 | (2006.01) |
| H01F 27/24 | (2006.01) |
| H01F 27/28 | (2006.01) |
| H03H 7/01 | (2006.01) |

(52) U.S. Cl.
CPC ............. *H01F 27/36* (2013.01); *H01F 27/24* (2013.01); *H01F 27/2804* (2013.01); *H03H 7/0138* (2013.01); *H01F 2027/2809* (2013.01)

(58) Field of Classification Search
CPC ...... H01F 27/36; H01F 27/24; H01F 27/2804; H01F 2027/2809; H03H 7/0138
USPC .................................................. 333/181, 185
See application file for complete search history.

(56) References Cited

U.S. PATENT DOCUMENTS

| 8,422,190 | B2 * | 4/2013 | Ito ........................ H03H 7/0107 361/119 |
| 9,444,250 | B2 * | 9/2016 | Yang ..................... H02H 9/045 |
| 2011/0007438 | A1 | 1/2011 | Ito et al. |
| 2015/0029623 | A1 | 1/2015 | Yang et al. |
| 2015/0145627 | A1 | 5/2015 | Sim et al. |

FOREIGN PATENT DOCUMENTS

| KR | 10-2009-0033690 A | 4/2009 |
| KR | 10-2010-0037000 A | 4/2010 |
| KR | 10-2015-0012828 A | 2/2015 |
| KR | 10-2015-0062012 A | 6/2015 |
| KR | 10-2018-0101048 A | 9/2018 |
| WO | 2009/045008 A3 | 5/2009 |

* cited by examiner

*Primary Examiner* — Hai L Nguyen
(74) *Attorney, Agent, or Firm* — Maschoff Brennan

(57) ABSTRACT

Disclosed is a stacked common mode filter in which an ESD absorption layer is arranged in a common mode filter applied to the mipi C-PHY standard, so that damage to an element caused by ESD is prevented while a change in filter performance is prevented. The disclosed stacked common mode filter comprises: a filter layer having a plurality of coils; a lower magnetic layer arranged below the filter layer; an upper magnetic layer arranged on the filter layer; and an ESD absorption layer arranged inside the lower magnetic layer and/or the upper magnetic layer.

20 Claims, 13 Drawing Sheets

[FIG. 1]
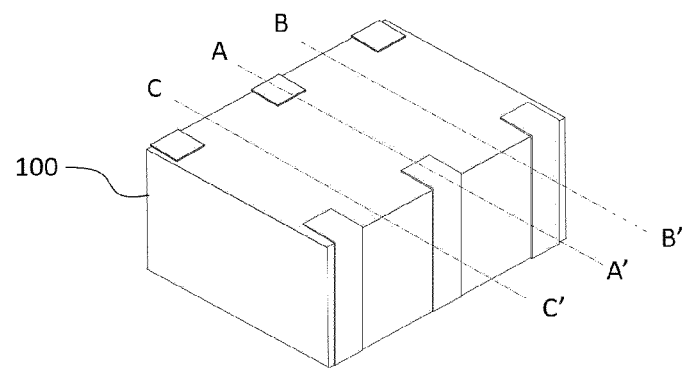
[FIG. 2]
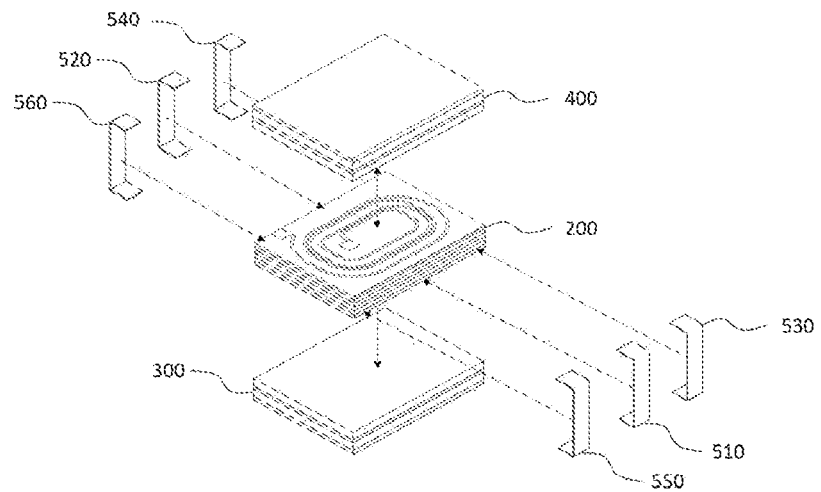

[FIG. 3]
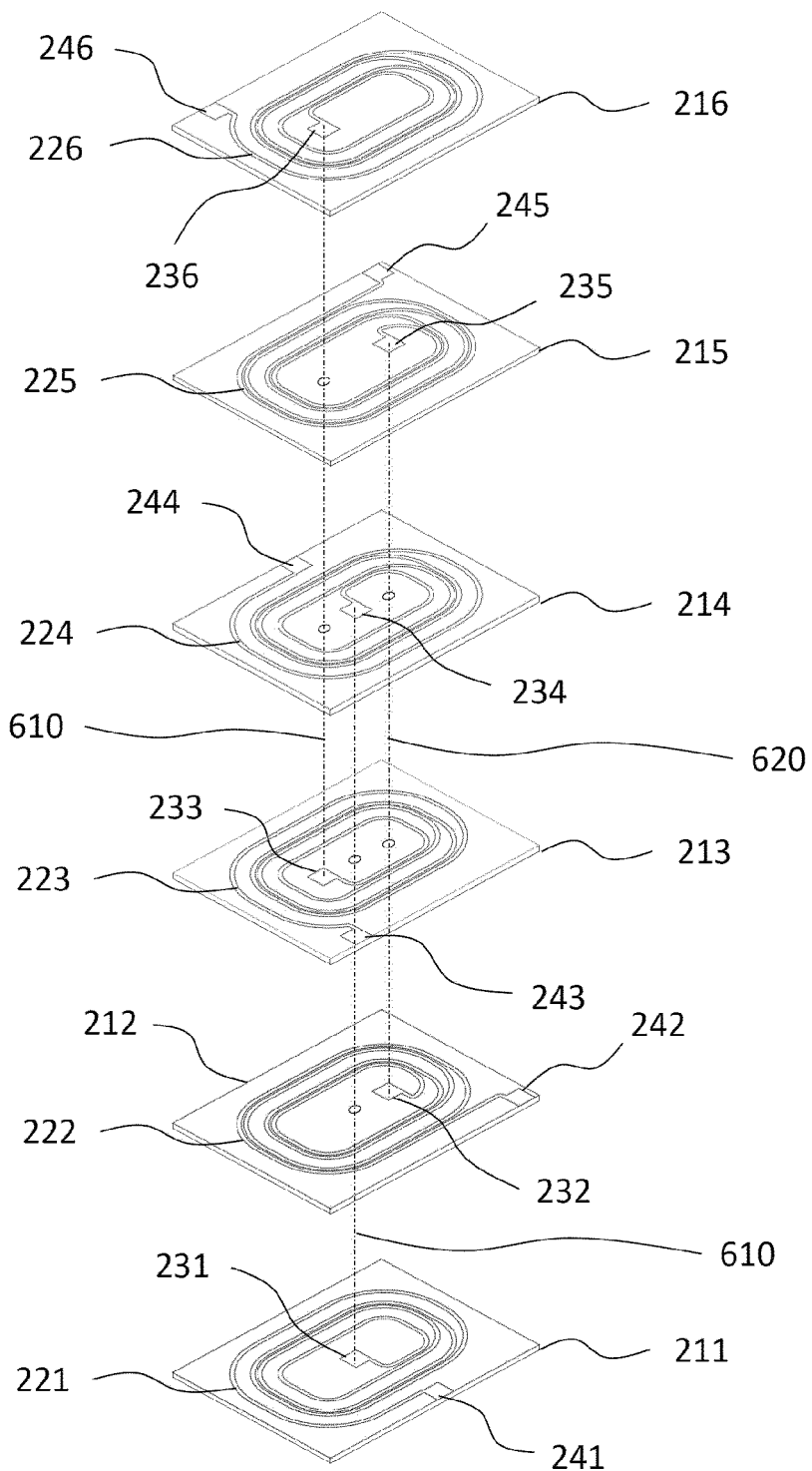

[FIG. 4]
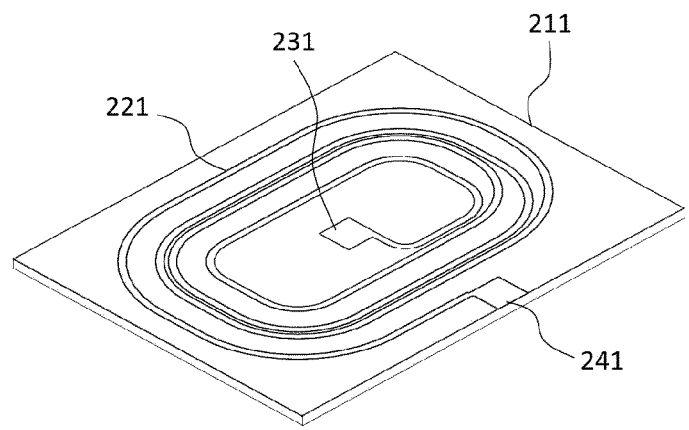
[FIG. 5]
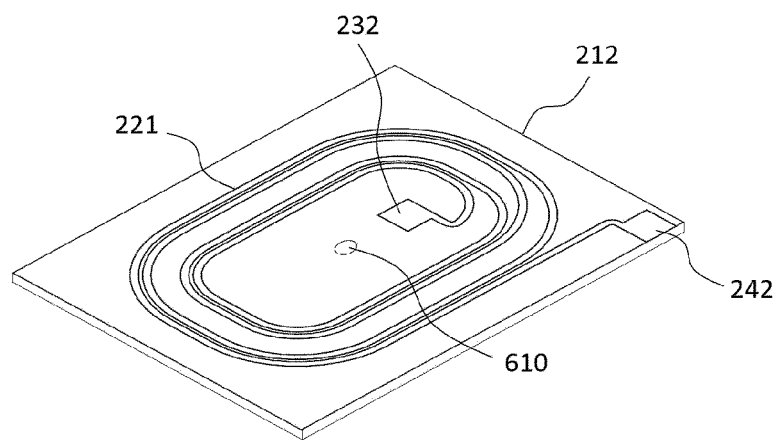

[FIG. 6]
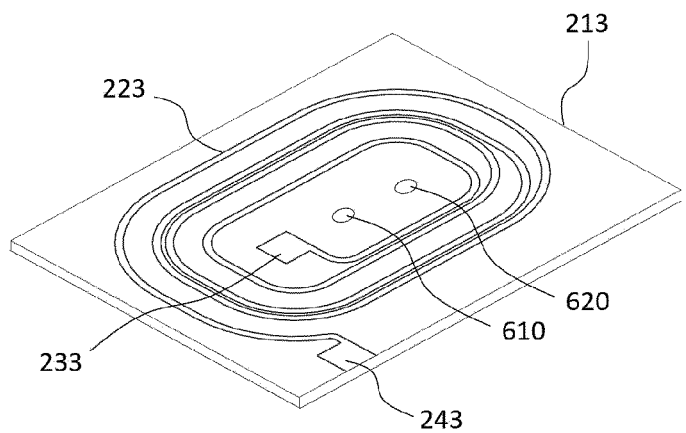
[FIG. 7]
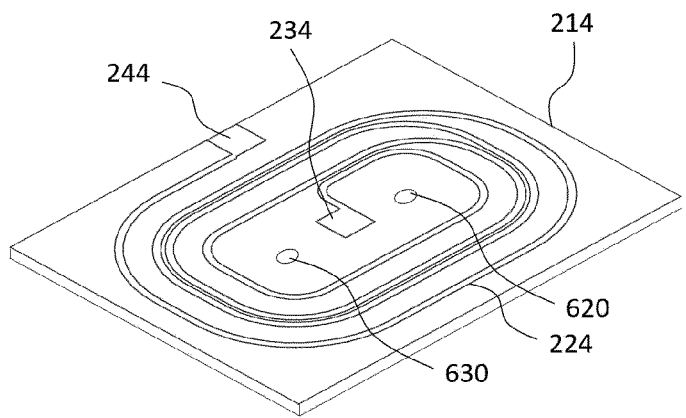

[FIG. 8]
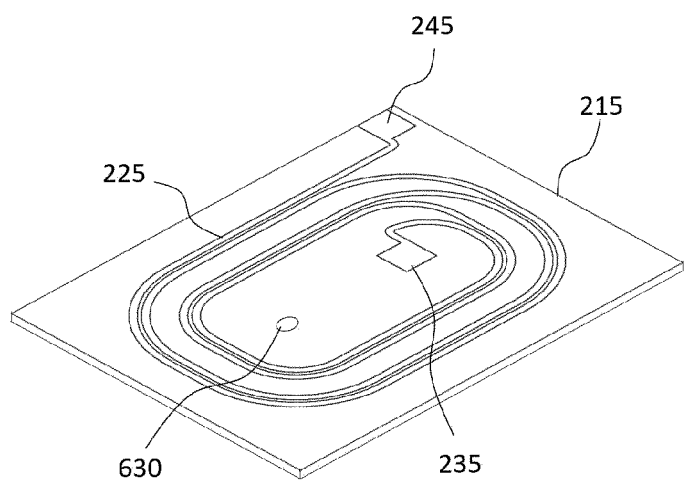
[FIG. 9]
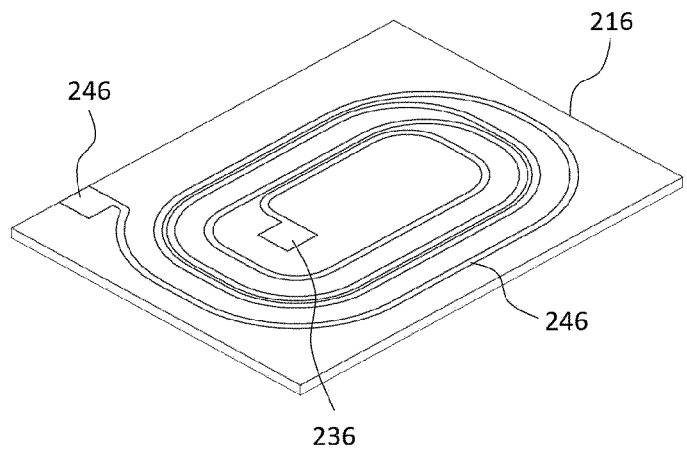

[FIG. 10]
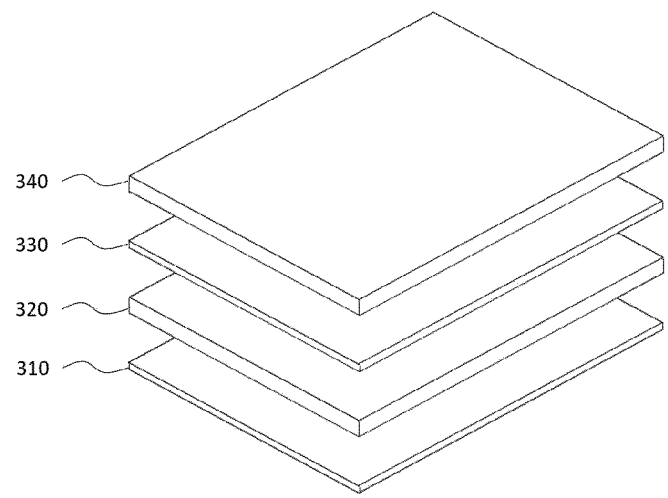
[FIG. 11]
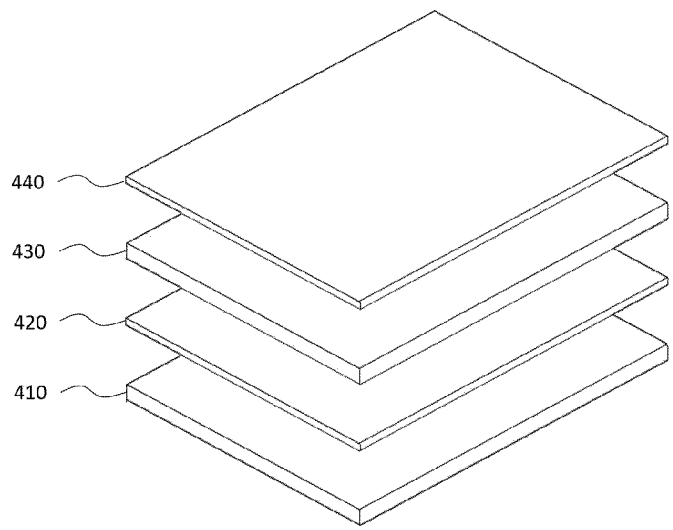

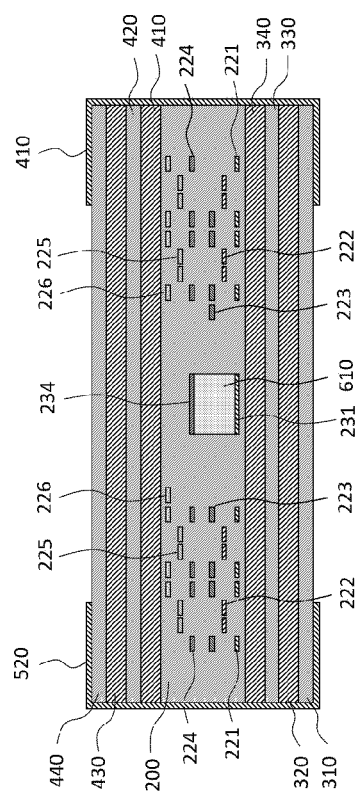
[FIG.12]

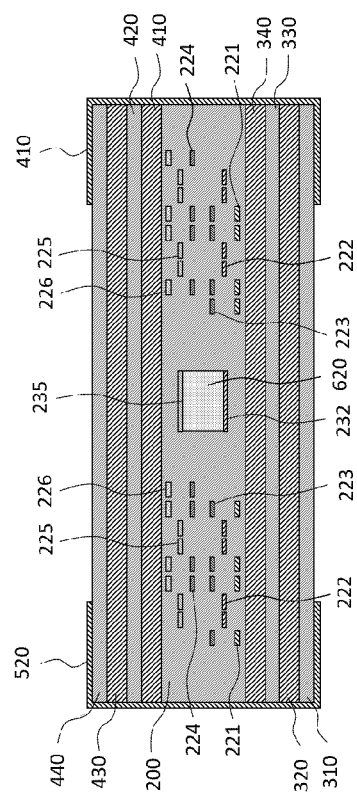
[FIG.13]

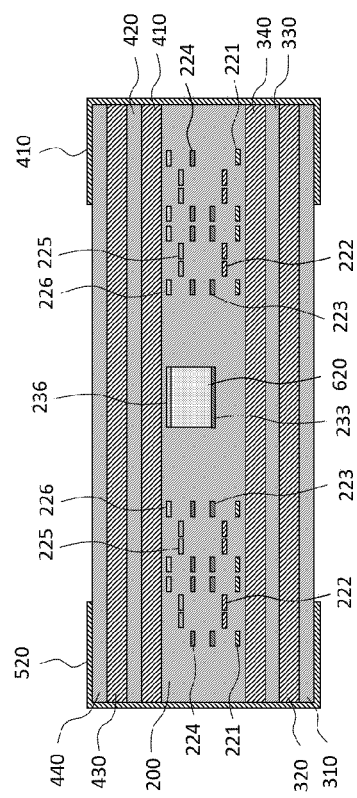
[FIG.14]

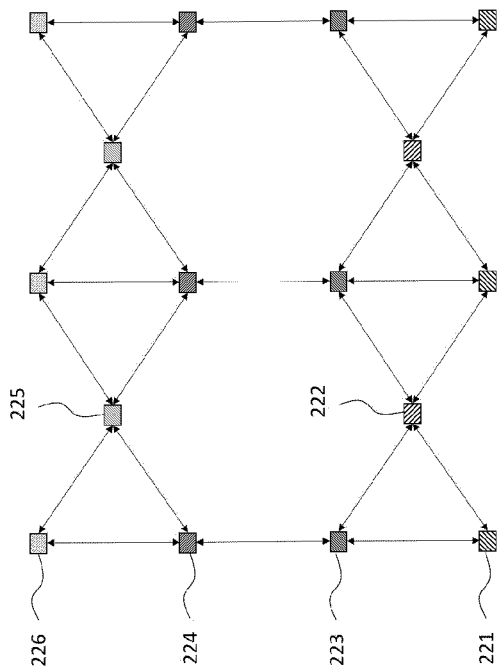
[FIG. 15]
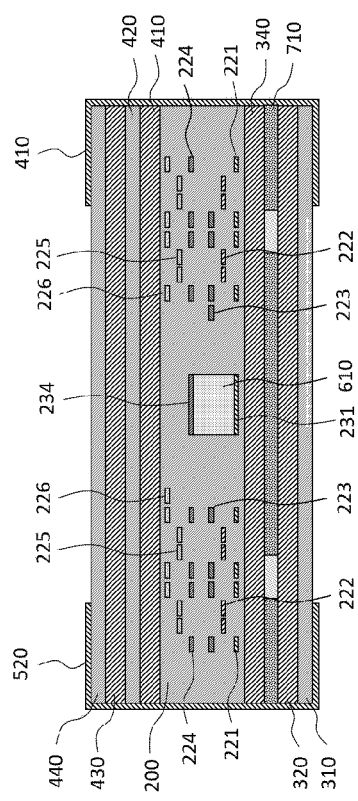
[FIG.16]

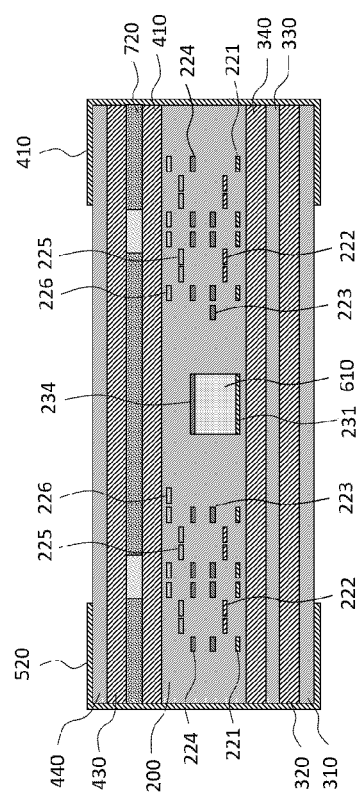
[FIG.17]

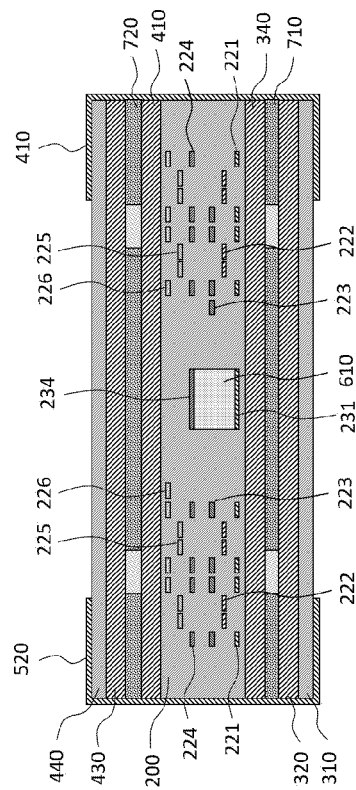
[FIG.18]
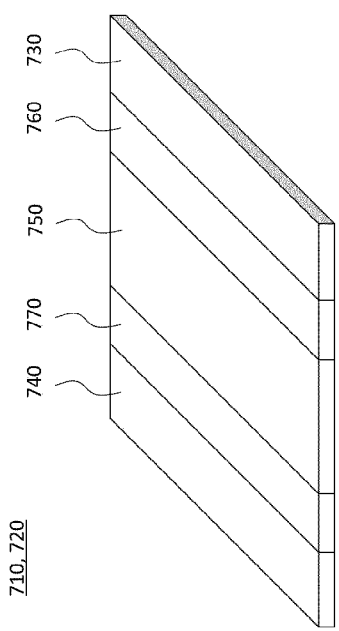
[FIG.19]

[FIG.20]
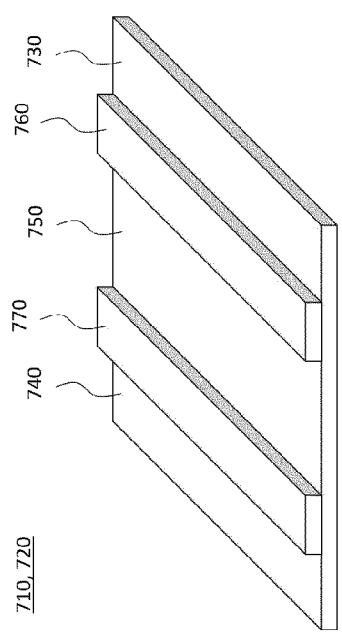

STACKED COMMON MODE FILTER

TECHNICAL FIELD

The present disclosure relates to a stacked common mode filter, and more specifically, to a stacked common mode filter used in an electronic device to which a high-speed signal line is applied.

BACKGROUND ART

In general, a mobile terminal adopts the mobile industry processor interface (mipi) D-PHY standard as a digital data transmission standard. The mipi D-PHY standard is a digital data transmission standard that connects a main circuit of the mobile terminal to a display or a camera, and is a method of transmitting data as a differential signal using two transmission lines.

As the data transmitted and received within the mobile terminal rapidly increases, the mobile terminal requires a transmission method capable of transmitting and receiving data at a higher speed than the mipi D-PHY.

Accordingly, recently, in the mobile terminal industry, research to apply the mipi C-PHY standard to the mobile terminal is in progress. The mipi C-PHY standard is a method of implementing a differential output by sending different voltages from the transmitting side to each transmission line using three transmission lines, and taking a difference between lines on the receiving side.

SUMMARY OF INVENTION

Technical Problem

The present disclosure has been proposed in consideration of the above circumstance, and an object of the present disclosure is to provide a stacked common mode filter, which arranges an ESD absorption layer in a common mode filter applied to the mipi C-PHY standard, thereby preventing a change in filter performance and preventing damage to an element caused by ESD.

Solution to Problem

In order to achieve the object, a stacked common mode filter according to an exemplary embodiment of the present disclosure includes a filter layer formed with a plurality of coils, a lower magnetic layer arranged under the filter layer, an upper magnetic layer arranged above the filter layer, and an ESD absorption layer arranged in at least one of the lower magnetic layer and the upper magnetic layer.

The ESD absorption layer may include a lower ESD absorption layer interposed between the two magnetic sheets constituting the lower magnetic layer. At this time, the lower magnetic layer includes a first magnetic sheet arranged under the filter layer and a second magnetic sheet arranged between the filter layer and the first magnetic sheet, in which the lower ESD absorption layer is interposed between the first magnetic sheet and the second magnetic sheet.

The ESD absorption layer may include an upper ESD absorption layer interposed between the two magnetic sheets constituting the upper magnetic layer. At this time, the upper magnetic layer includes a third magnetic sheet arranged above the filter layer and a fourth magnetic sheet arranged above the third magnetic sheet, in which the upper ESD absorption layer is interposed between the third magnetic sheet and the fourth magnetic sheet.

The ESD absorption layer includes a first ESD absorber, a second ESD absorber spaced apart from the first ESD absorber, and a ground interposed between the first ESD absorber and the second ESD absorber.

The ESD absorption layer may further include a first input/output arranged between the first ESD absorber and an external electrode and electrically connected to the first ESD absorber and the external electrode, and a second input/output arranged between the second ESD absorber and the external electrode and electrically connected to the second ESD absorber and the external electrode.

Meanwhile, the ESD absorption layer may also be configured to include a plate-shaped conductor, a first ESD absorber stacked on an upper surface of the plate-shaped conductor, and a second ESD absorber stacked on the upper surface of the plate-shaped conductor and arranged to be spaced apart from the first ESD absorber.

The filter layer may have a plurality of nonmagnetic sheets formed with coil patterns stacked thereon and include a plurality of nonmagnetic sheets stacked in a stacking direction, a first coil formed on a laminate in which the plurality of nonmagnetic sheets are stacked, a second coil formed on the laminate and independent of the first coil, and a third coil formed on the laminate and independent of the first coil and the second coil.

The first coil may include a first coil pattern of a loop shape that winds a winding axis parallel to the stacking direction a plurality of times, the second coil may include a second coil pattern of the loop shape that winds the winding axis the plurality of times, and the third coil may include a third coil pattern of the loop shape that winds the winding axis the plurality of times.

Nth and (N+1)th winding portions from an inner circumference of the second coil pattern in the direction of one side surface of the winding axis may be arranged between Nth and (N+1)th winding portions from an inner circumference of the first coil pattern, and N may be the odd number of 1 or more and equal to or less than the number of windings of the second coil pattern.

Nth and (N+1)th winding portions from an inner circumference of the third coil pattern in the direction of one side surface of the winding axis may each overlap the Nth and (N+1)th winding portions from the inner circumference of the first coil pattern, and (M+1)th winding portions from the inner circumference of the third coil pattern in the direction of the other side surface of the winding axis may each overlap Mth winding portions from the inner circumference of the first coil pattern, in which M may be 1 or more and equal to or less than the number of windings of the third coil pattern.

Nth and (N+1)th winding portions from an inner circumference of the second coil pattern in the direction of one side surface of the winding axis may be arranged between Nth and (N+1)th winding portions from an inner circumference of the first coil pattern, and the Nth and (N+1)th winding portions from the inner circumference of the second coil pattern in the direction of the other side surface of the winding axis may be arranged between (N+1)th and (N+2)th winding portions. At this time, Nth and (N+1)th winding portions from the inner circumference of the third coil pattern may each overlap Nth and (N+1)th winding portions from the inner circumference of the first coil pattern.

The first coil pattern, the second coil pattern, and the third coil pattern in the direction of one side surface of the winding axis may be arranged so that portions having the same number of windings from the inner circumferences have the same separation distances from one another.

An Xth winding portion from the inner circumference of the second coil pattern, an Xth winding portion from the inner circumference of the first coil pattern, and an (X+1)th winding portion from the inner circumference of the third coil pattern in the direction of the other side of the winding axis may have the same separation distances from one another, in which X may be 1 or more and equal to or less than the number of windings of the second coil pattern.

An Xth winding portion from the inner circumference of the second coil pattern and (X+1)th winding portions from the inner circumferences of the first coil pattern and the third coil pattern in the direction of the other side surface of the winding axis may have the same separation distances from one another, in which X may be 1 or more and equal to or less than the number of windings of the second coil pattern.

The first coil pattern, the second coil pattern, and the third coil pattern in the direction of the other side surface of the winding axis may be arranged so that portions having the same number of windings from the inner circumferences have the same separation distances from one another.

Advantageous Effects of Invention

According to the present disclosure, the stacked common mode filter may form the ESD absorption layer on the magnetic layer arranged above or below the filter layer, thereby preventing the defect and failure caused by ESD instantaneously generated in the substrate.

In addition, the stacked common mode filter may form the ESD absorption layer on the magnetic layer arranged above or below the filter layer, thereby preventing defect and failure caused by ESD instantaneously generated in the substrate and minimizing the ESD absorptiveness and the change in the characteristics of the filter.

In addition, the stacked common mode filter may form the ESD absorption layer on the magnetic layer arranged above or below the filter layer to operate the other ESD absorption layer even if one ESD absorption layer is destroyed, thereby preventing the defect and failure caused by ESD.

In addition, the stacked common mode filter may equally form the separation distance (interval) between the coil patterns constituting the first coil to the third coil, thereby improving the balance of the magnetic coupling (i.e., electromagnetic coupling) between the first coil to the third coil and minimizing the deterioration of the differential signal.

BRIEF DESCRIPTION OF DRAWINGS

FIGS. 1 and 2 are diagrams for explaining a stacked common mode filter according to an exemplary embodiment of the present disclosure.

FIGS. 3 to 9 are diagram for explaining a filter layer of FIG. 2.

FIG. 10 is a diagram for explaining a lower magnetic layer of FIG. 2.

FIG. 11 is a diagram for explaining an upper magnetic layer of FIG. 2.

FIGS. 12 to 15 are diagrams for explaining a coil pattern included in the filter layer of FIG. 2.

FIGS. 16 to 18 are diagrams for explaining a modified example of the stacked common mode filter according to the exemplary embodiment of the present disclosure.

FIGS. 19 and 20 are diagrams for explaining a configuration of an ESD absorption layer.

DESCRIPTION OF EMBODIMENTS

Hereinafter, the most preferred exemplary embodiments of the present disclosure will be described with reference to the accompanying drawings in order to specifically describe the exemplary embodiments so that those skilled in the art to which the present disclosure pertains may easily implement the technical spirit of the present disclosure. First, in adding reference numerals to the components of each drawing, it should be noted that the same components have the same reference numerals as much as possible even if they are illustrated in different drawings. In addition, in describing the present disclosure, when it is determined that the detailed description of the related well-known configuration or function may obscure the gist of the present disclosure, the detailed description thereof will be omitted.

Referring to FIGS. 1 and 2, a stacked common mode filter 100 according to a first exemplary embodiment of the present disclosure includes a filter layer 200, a lower magnetic layer 300, an upper magnetic layer 400, and a plurality of external electrodes.

The filter layer 200 is a nonmagnetic laminate in which a plurality of coils are formed. The filter layer 200 is configured by stacking a plurality of nonmagnetic sheets on which a coil pattern is formed, and formed with a plurality of coils with coil patterns stacked on the nonmagnetic sheets.

At this time, the coil patterns may be formed and arranged to have the same line width, interline, and interlayer. For example, the coil patterns may be formed to have a line width of about 10 to 122 μm, an interline of about 10 μm, and an interlayer of about 10.5 μm.

Referring to FIG. 3, the filter layer 200 includes the plurality of nonmagnetic sheets and the plurality of coil patterns each formed on the plurality of nonmagnetic sheets. Each of the plurality of nonmagnetic sheets has an upper surface and a lower surface.

Hereinafter, the stacked common mode filter 100 composed of the plurality of nonmagnetic sheets including a first nonmagnetic sheet 211, a second nonmagnetic sheet 212, a third nonmagnetic sheet 213, a fourth nonmagnetic sheet 214, a fifth nonmagnetic sheet 215, and a sixth nonmagnetic sheet 216, and the plurality of coil patterns including a first coil pattern 221, a second coil pattern 222, a third coil pattern 223, a fourth coil pattern 224, a fifth coil pattern 225, and a sixth coil pattern 226 will be described as an example.

The plurality of nonmagnetic sheets are sequentially stacked in a stacking direction (i.e., from bottom to top) to constitute a nonmagnetic laminate. In other words, the second nonmagnetic sheet 212 is stacked on an upper surface of the first nonmagnetic sheet 211, and the third non-magnetic sheet 213 is stacked on an upper surface of the second nonmagnetic sheet 212. The fourth nonmagnetic sheet 214 is stacked on an upper surface of the third nonmagnetic sheet 213. The fifth nonmagnetic sheet 215 is stacked on an upper surface of the fourth nonmagnetic sheet 214. The fifth nonmagnetic sheet 215 is stacked on an upper surface of the fourth nonmagnetic sheet 214. The sixth nonmagnetic sheet 216 is stacked on an upper surface of the fourth nonmagnetic sheet 214. Accordingly, the nonmagnetic laminate in which the first nonmagnetic sheet 211 and the second nonmagnetic sheet 212 are sequentially stacked in the stacking direction is configured.

For example, the plurality of nonmagnetic sheets are a low-temperature calcined ceramic (LTCC) sheet, which is an insulating nonmagnetic material including silicon oxide. At this time, the plurality of nonmagnetic sheets may have the same thickness T1.

The plurality of coil patterns are each formed on the plurality of nonmagnetic sheets. In other words, the first coil pattern 221 is formed on the upper surface of the first nonmagnetic sheet 211. The second coil pattern 222 is formed on the upper surface of the second nonmagnetic sheet 212. The third coil pattern 223 is formed on the upper surface of the third nonmagnetic sheet 213. The fourth coil pattern 224 is formed on the upper surface of the fourth nonmagnetic sheet 214. The fifth coil pattern 225 is formed on the upper surface of the fifth nonmagnetic sheet 215. The sixth coil pattern 226 is formed on the upper surface of the sixth nonmagnetic sheet 216.

Two of the plurality of coil patterns are paired to form one coil. In other words, the first coil pattern 221 and the fourth coil pattern 224 form a first coil. The second coil pattern 222 and the fifth coil pattern 225 form a second coil. The third coil pattern 223 and the sixth coil pattern 226 form a third coil.

The paired coil patterns are electrically connected through a via hole formed to penetrate at least one nonmagnetic sheet. In other words, the first coil pattern 221 and the fourth coil pattern 224 are electrically connected through a first via hole 610 formed to penetrate the second nonmagnetic sheet 212 to the fourth nonmagnetic sheet 214. The second coil pattern 222 and the fifth coil pattern 225 are electrically connected through a second via hole 620 formed to penetrate the third nonmagnetic sheet 213 to the fifth nonmagnetic sheet 215. The third coil pattern 223 and the sixth coil pattern 226 are electrically connected through a third via hole 630 formed to penetrate the fourth nonmagnetic sheet 214 to the sixth nonmagnetic sheet 216.

The plurality of coil patterns may be formed by plating or printing a conductive material such as silver on the upper surface of the nonmagnetic sheet in a spiral shape.

The plurality of coil patterns have a loop shape that winds a virtual winding axis perpendicularly intersecting the center point of the nonmagnetic sheet once or more. The plurality of coil patterns have a rounded corner rectangular loop in which long and short sides are repeated.

For example, when the nonmagnetic sheet has a rectangular shape having first and second sides parallel to each other, and third and fourth sides parallel to each other and having both ends each connected to both ends of the first and second sides, a horizontal direction is a direction parallel to the first and second sides, and a vertical direction is a direction parallel to the third and fourth sides.

Hereinafter, shapes of the first coil patterns 221 to the sixth coil patterns 226 will be described with reference to the accompanying drawings.

Referring to FIG. 4, the first coil pattern 221 has a loop shape that winds the winding axis a plurality of times. The first coil pattern 221 has the loop shape in which the long and short sides are continuously wound around the winding axis in a frame having the rounded corner rectangular shape having the long and short sides. One end of the first coil pattern 221 is connected to a first inner circumferential terminal pattern 231 arranged on an inner circumference of the frame. The other end of the first coil pattern 221 is connected to a first outer circumferential terminal pattern 241 arranged on an outer circumference of the frame.

Referring to FIG. 5, the second coil pattern 222 has the loop shape that winds the winding axis the plurality of times. The second coil pattern 222 has the loop shape in which the long and short sides are continuously wound around the winding axis in the frame of the rounded corner rectangular shape having the long and short sides. One end of the second coil pattern 222 is connected to a second inner circumferential terminal pattern 232 arranged on the inner circumference of the frame. The other end of the second coil pattern 222 is connected to a second outer circumferential terminal pattern 242 arranged on the outer circumference of the frame.

Referring to FIG. 6, the third coil pattern 223 has the loop shape that winds the winding axis the plurality of times. The third coil pattern 223 has the loop shape in which the long and short sides are continuously wound around the winding axis in the frame of the rounded corner rectangular shape having the long and short sides. One end of the third coil pattern 223 is connected to a third inner circumferential terminal pattern 233 arranged on the inner circumference of the frame. The other end of the third coil pattern 223 is connected to a third outer circumferential terminal pattern 243 arranged on the outer circumference of the frame.

Referring to FIG. 7, the fourth coil pattern 224 has the loop shape that winds the winding axis the plurality of times. The fourth coil pattern 224 has the loop shape in which the long and short sides are continuously wound around the winding axis in the frame of the rounded corner rectangular shape having the long and short sides. One end of the fourth coil pattern 224 is connected to a fourth inner circumferential terminal pattern 234 arranged on the inner circumference of the frame. The other end of the fourth coil pattern 224 is connected to a fourth outer circumferential terminal pattern 244 arranged on the outer circumference of the frame.

Referring to FIG. 8, the fifth coil pattern 225 has the loop shape that winds the winding axis the plurality of times. The fifth coil pattern 225 has the loop shape in which the long and short sides are continuously wound around the winding axis in the frame of the rounded corner rectangular shape having the long and short sides. One end of the fifth coil pattern 225 is connected to a fifth inner circumferential terminal pattern 235 arranged on the inner circumference of the frame. The other end of the fifth coil pattern 225 is connected to a fifth outer circumferential terminal pattern 245 arranged on the outer circumference of the frame.

Referring to FIG. 9, the sixth coil pattern 226 has the loop shape that winds the winding axis the plurality of times. The sixth coil pattern 226 has the loop shape in which the long and short sides are continuously wound around the winding axis in the frame of the rounded corner rectangular shape having the long and short sides. One end of the sixth coil pattern 226 is connected to a sixth inner circumferential terminal pattern 236 arranged on the inner circumference of the frame. The other end of the sixth coil pattern 226 is connected to a sixth outer circumferential terminal pattern 246 arranged on the outer circumference of the frame.

The first inner circumferential terminal pattern 231 and the second outer circumferential terminal pattern 242 are spaced apart from each other by the second nonmagnetic sheet 212 to the fourth nonmagnetic sheet 214 and arranged to overlap each other at least partially. The first outer circumferential terminal pattern 241 and the third inner circumferential terminal pattern 233 are spaced apart from each other by the third nonmagnetic sheet 213 to the fifth nonmagnetic sheet 215 and arranged to overlap each other at least partially. The second inner circumferential terminal pattern 232 and the third outer circumferential terminal pattern 243 are spaced apart from each other by the fourth nonmagnetic sheet 214 to the sixth nonmagnetic sheet 216 and arranged to overlap each other at least partially.

The first outer circumferential terminal pattern 241, the second outer circumferential terminal pattern 242, and the third outer circumferential terminal pattern 243 are arranged to be in contact with one of the two long sides of the nonmagnetic sheet, and the fourth outer circumferential terminal pattern 244, the fifth outer circumferential terminal pattern 245, and the sixth outer circumferential terminal pattern 246 are arranged to be in contact with the other of the two long sides of the nonmagnetic sheet.

The first outer circumferential terminal pattern 241, the second outer circumferential terminal pattern 242, and the third outer circumferential terminal pattern 243 are each arranged to face the fourth outer circumferential terminal pattern 244, the fifth outer circumferential terminal pattern 245, and the sixth outer circumferential terminal pattern 246. In other words, the first outer circumferential terminal pattern 241 is arranged to face the fourth outer circumferential terminal pattern 244 with respect to a virtual straight line passing through the center point of the nonmagnetic sheet and parallel to the two long sides of the nonmagnetic sheet. The second outer circumferential terminal pattern 242 is arranged to face the fifth outer circumferential terminal pattern 245 with respect to the virtual straight line passing through the center point of the nonmagnetic sheet and parallel to the two long sides of the nonmagnetic sheet. The third outer circumferential terminal pattern 243 is arranged to face the sixth outer circumferential terminal pattern 246 with respect to the virtual straight line passing through the center point of the nonmagnetic sheet and parallel to the two long sides of the nonmagnetic sheet.

As the first nonmagnetic sheet 211 to the sixth nonmagnetic sheet 216 are sequentially stacked, the first coil pattern 221 to the sixth coil pattern 226 are sequentially arranged from bottom to top.

Accordingly, the second coil pattern 222 forming the second coil and the third coil pattern 223 forming the third coil are arranged between the first coil pattern 221 and the fourth coil pattern 224 that form the first coil, the third coil pattern 223 forming the third coil and the fourth coil pattern 224 forming the first coil are arranged between the second coil pattern 222 and the fifth coil pattern 225 forming the second coil, and the fourth coil pattern 224 forming the first coil and the fifth coil pattern 225 forming the second coil are arranged between the third coil pattern 223 and the sixth coil pattern that form the third coil.

One of two coil patterns constituting the other coils (i.e., the remaining coils among the first to third coils) is arranged between the two coil patterns constituting the coil (i.e., one of the first to third coils). In other words, two coil patterns constituting the other coils are arranged between the two coil patterns constituting the coil.

The lower magnetic layer 300 is arranged under the filter layer 200. In other words, the lower magnetic layer 300 is stacked under the filter layer 200 and arranged at a lowermost portion of the stacked common mode filter 100. The lower magnetic layer 300 includes a plurality of magnetic sheets and a plurality of nonmagnetic sheets. The plurality of magnetic sheets and the plurality of nonmagnetic sheets are alternately stacked.

For example, referring to FIG. 10, the lower magnetic layer 300 has a seventh nonmagnetic sheet 310, a first magnetic sheet 320, an eighth nonmagnetic sheet 330, and a second magnetic sheet 340 sequentially stacked from bottom to top. In other words, the seventh nonmagnetic sheet 310 is arranged on a lowermost portion of the lower magnetic layer 300. The first magnetic sheet 320 is stacked on an upper surface of the seventh nonmagnetic sheet 310. The eighth nonmagnetic sheet 330 is stacked on an upper surface of the first magnetic sheet 320. The second magnetic sheet 340 is stacked on an upper surface of the eighth nonmagnetic sheet 330. At this time, as the lower magnetic layer 300 is arranged under the filter layer 200, the first nonmagnetic sheet 211 is stacked on an upper surface of the second magnetic sheet 340.

The upper magnetic layer 400 is arranged above the filter layer 200. In other words, the upper magnetic layer 400 is stacked above the filter layer 200 and arranged on an uppermost portion of the stacked common mode filter 100. The upper magnetic layer 400 includes a plurality of magnetic sheets and a plurality of nonmagnetic sheets. The plurality of magnetic sheets and the plurality of nonmagnetic sheets are alternately stacked.

For example, referring to FIG. 11, the upper magnetic layer 400 has a third magnetic sheet 420, a ninth nonmagnetic sheet 410, a fourth magnetic sheet 440, and a tenth nonmagnetic sheet 430 sequentially stacked from bottom to top. In other words, the third magnetic sheet 420 is arranged on a lowermost portion of the upper magnetic layer 400. The ninth nonmagnetic sheet 410 is stacked on an upper surface of the third magnetic sheet 420. The fourth magnetic sheet 440 is stacked on an upper surface of the ninth nonmagnetic sheet 410. The tenth nonmagnetic sheet 430 is stacked on an upper surface of the fourth magnetic sheet 440. At this time, as the upper magnetic layer 400 is arranged above the filter layer 200, the third magnetic sheet 420 is stacked on an upper surface of the sixth nonmagnetic sheet 216.

A plurality of external electrodes are arranged over the upper surface, lower surface, and one side surface of the laminate in which the filter layer 200, the lower magnetic layer 300, and the upper magnetic layer 400 are stacked.

For example, the plurality of external electrodes include a first external electrode 510 and a second external electrode 520 electrically connected to the first coil, a third external electrode 530 and a fourth external electrode 540 electrically connected to the second coil, and a fifth external electrode 550 and a sixth external electrode 560 electrically connected to the third coil.

The first external electrode 510 is electrically connected to the first coil pattern 221 through the first outer circumferential terminal pattern 241 formed on the first nonmagnetic sheet 211, and the second external electrode 520 is electrically connected to the fourth coil pattern 224 through the eighth terminal pattern formed on the fourth nonmagnetic sheet 214. At this time, the first coil pattern 221 and the fourth coil pattern 224 are electrically connected to each other through the first via hole 610 to form the first coil, and as a result, the first external electrode 510 is electrically connected to one end of the first coil, and the second external electrode 520 is electrically connected to the other end of the first coil.

The third external electrode 530 is electrically connected to the second coil pattern 222 through the second outer circumferential terminal pattern 242 formed on the second nonmagnetic sheet 212. The fourth external electrode 540 is electrically connected to the fifth coil pattern 225 through the tenth terminal pattern formed on the fifth nonmagnetic sheet 215. At this time, the second coil pattern 222 and the fifth coil pattern 225 are electrically connected through the second via hole 620 to form the second coil, and as a result, the third external electrode 530 is electrically connected to one end of the second coil, and the fourth external electrode 540 is electrically connected to the other end of the second coil.

The fifth external electrode 550 is electrically connected to the third coil pattern 223 through the third outer circumferential terminal pattern 243 formed on the third nonmagnetic sheet 213, and the sixth external electrode 560 is electrically connected to the sixth coil pattern 226 through the twelfth terminal pattern formed on the six nonmagnetic sheet 216. At this time, the third coil pattern 223 and the sixth coil pattern 226 are electrically connected through the third via hole 630 to form the third coil, and as a result, the fifth external electrode 550 is electrically connected to one end of the third coil, and the sixth external electrode 560 is electrically connected to the other end of the third coil.

Referring to FIGS. 12 to 14, the first coil pattern 221 and the fourth coil pattern 224 are electrically connected through the first via hole 610 to form the first coil. The second coil pattern 222 and the fifth coil pattern 225 are electrically connected through the second via hole 620 to form the second coil. The third coil pattern 223 and the sixth coil pattern 226 are electrically connected through the third via hole 630 to form the third coil.

In addition, the first coil pattern 221 and the third coil pattern 223 are arranged to be shifted in a horizontal direction (i.e., left and right directions) perpendicular to the stacking direction of the second coil pattern 222 and the nonmagnetic sheets. The fourth coil pattern 224 and the sixth coil pattern 226 are arranged to be shifted in the horizontal direction (i.e., left and right directions) perpendicular to the stacking direction of the fifth coil pattern 225 and the nonmagnetic sheets.

Referring to FIG. 12, the second coil pattern 222 has Nth and (N+1)th winding portions from the inner circumference arranged between the Nth and (N+1)th winding portions from the inner circumference of the first coil pattern 221 in the direction of one side surface of the winding axis. Here, N is an odd number of 1 or more and is equal to or less than the number of windings of the second coil pattern 222.

The third coil pattern 223 has Nth and (N+1)th winding portions from the inner circumference each overlapping Nth and (N+1)th winding portions from the inner circumference of the first coil pattern 221 in the direction of one side surface of the winding axis. The third coil pattern 223 has (M+1)th winding portions from the inner circumference each overlapping Mth winding portions from the inner circumference of the first coil pattern 221 in the direction of the other side surface of the winding axis. Here, M is 1 or more and equal to or less than the number of windings of the third coil pattern 223.

Referring to FIG. 13, the second coil pattern 222 has Nth and (N+1)th winding portions from the inner circumference arranged between the Nth and (N+1)th winding portions from the inner circumference of the first coil pattern 221 in the direction of one side surface of the winding axis. The second coil pattern 222 has Nth and (N+1)th winding portions from the inner circumference arranged between (N+1)th and (N+2)th winding portions from the inner circumference of the second coil pattern 222 in the direction of the other side surface of the winding axis. The third coil pattern 223 has Nth and (N+1)th winding portions from the inner circumference each overlapping the Nth and (N+1)th winding portions from the inner circumference of the first coil pattern 221.

Referring to FIG. 14, the second coil pattern 222 has the Nth and (N+1)th winding portions from the inner circumference arranged between the Nth and (N+1)th winding portions from the inner circumference of the first coil pattern 221 in the direction of both side surfaces of the winding axis. The third coil pattern 223 has Nth and (N+1)th winding portions from the inner circumference each overlapping the Nth and (N+1)th winding portions from the inner circumference of the first coil pattern 221.

Referring to FIG. 15, all of the shortest length between the first coil pattern 221 and the second coil pattern 222, the shortest length between the first coil pattern 221 and the third coil pattern 223, and the shortest length between the second coil pattern 222 and the third coil pattern 223 with respect to the cross section of the stacked common mode filter 100 have the same length. The shortest length between the fourth coil pattern 224 and the fifth coil pattern 225, the shortest length between the fourth coil pattern 224 and the sixth coil pattern 226, and the shortest length between the fifth coil pattern 225 and the sixth coil pattern 226 with respect to the cross section of the stacked common mode filter 100 have the same length. At this time, the shortest length between the third coil pattern 223 and the fourth coil pattern 224 also has the same length. Here, the shortest length means a separation distance between the coil patterns.

As described above, the first coil pattern 221, the second coil pattern 222, and the third coil pattern 223 are arranged so that the portions having the same number of windings from the inner circumferences in the direction of one side surface of the winding axis have the same separation distances from one another.

The first coil pattern 221, the second coil pattern 222, and the third coil pattern 223 are arranged so that the portions having the same number of windings from the inner circumferences in the direction of the other side surface of the winding axis have the same separation distances from one another.

For example, the second coil pattern 222 is arranged so that the Xth winding portion from the inner circumference in the other side surface of the winding axis has the same separation distances from the Xth winding portion from the inner circumference of the first coil pattern 221 and the (X+1)th winding portion from the inner circumference of the third coil pattern 223. At this time, X is 1 or more and equal to or less than the number of windings of the second coil pattern 222.

As another example, the second coil pattern 222 is arranged so that the Xth winding portion from the inner circumference in the direction of the other side surface of the winding axis has the same separation distances from (X+1)th winding portions from the inner circumferences of the first coil pattern 221 and the third coil pattern 223.

Accordingly, the stacked common mode filter 100 may improve the balance of the magnetic coupling (i.e., electromagnetic coupling) between the first to third coils and minimize deterioration of the differential signal.

Meanwhile, the stacked common mode filter 100 may be defective or failed due to electrostatic discharge (ESD) instantaneously generated on the substrate. Accordingly, according to the exemplary embodiment of the present disclosure, an ESD protection function is added to at least one of the upper magnetic layer 400 and the lower magnetic layer 300, thereby preventing the defect and failure caused by ESD.

For example, referring to FIG. 16, the stacked common mode filter 100 includes a lower ESD absorption layer 710 formed on the lower magnetic layer 300 in order to protect the electrostatic discharge (ESD).

The lower ESD absorption layer 710 is formed on the lower magnetic layer 300 facing the substrate when the stacked common mode filter 100 is mounted. The lower ESD absorption layer 710 is interposed between the magnetic sheets constituting the lower magnetic layer 300. The lower ESD absorption layer 710 is interposed between the first magnetic sheet 320 and the second magnetic sheet 340 of the lower magnetic layer 300.

The lower ESD absorption layer 710 is electrically connected to the plurality of external electrodes. When the ESD generated on the substrate is applied through the external electrode, the lower ESD absorption layer 710 flows the applied ESD to the ground, thereby preventing the ESD from being delivered to the filter layer 200.

Referring to FIG. 17, the stacked common mode filter 100 includes an upper ESD absorption layer formed on the upper magnetic layer 400 in order to protect the electrostatic discharge (ESD).

The upper ESD absorption layer is formed on the upper magnetic layer 400 facing the substrate when the stacked common mode filter 100 is mounted. The upper ESD absorption layer is interposed between the magnetic sheets constituting the upper magnetic layer 400. The upper ESD absorption layer is interposed between the third magnetic sheet 420 and the fourth magnetic sheet 440 of the upper magnetic layer 400.

The upper ESD absorption layer is electrically connected to the plurality of external electrodes. When the ESD generated on the substrate is applied through the external electrode, the upper ESD absorption layer flows the applied ESD to the ground, thereby preventing the ESD from being delivered to the filter layer 200.

Meanwhile, the stacked common mode filter 100 includes only one of the lower ESD absorption layer 710 and the upper ESD absorption layer, and when the magnetic layer, which is mounted upside down and does not have the ESD absorption layer arranged, faces the substrate, the ESD absorptiveness may be reduced to cause the defect or failure caused by the ESD.

In addition, the stacked common mode filter 100 includes only one of the lower ESD absorption layer 710 and the upper ESD absorption layer, and may cause a change in the characteristics of the filter layer 200 when the magnetic layer, which is mounted upside down and does not have the ESD absorption layer arranged, faces the substrate.

Accordingly, the stacked common mode filter 100 may include both the lower ESD absorption layer 710 and the upper ESD absorption layer in order to prevent the ESD absorptiveness and the change in the characteristics of the filter. In other words, referring to FIG. 18, the stacked common mode filter 100 includes the lower ESD absorption layer 710 interposed in the lower magnetic layer 300 and the upper ESD absorption layer interposed in the upper magnetic layer 400. At this time, the lower ESD absorption layer 710 and the upper ESD absorption layer are electrically connected to the plurality of external electrodes.

Accordingly, the stacked common mode filter 100 minimizes the ESD absorptiveness and the change in the characteristics of the filter. The stacked common mode filter 100 may operate the other ESD absorption layer to protect the filter layer 200 from the ESD even if one of the lower ESD absorption layer 710 and the upper ESD absorption layer is destroyed by ESD.

Referring to FIG. 19, the ESD absorption layers (i.e., the lower ESD absorption layer 710 and the upper ESD absorption layer) are configured to include a first input/output 730, a second input/output 740, a ground 750, a first ESD absorber 760, and a second ESD absorber 770.

The ground 750 is arranged between the first ESD absorber 760 and the second ESD absorber 770. The first input/output 730 is arranged between the first ESD absorber 760 and the external electrode (i.e., the first external electrode 510, the third external electrode 530, and the fifth external electrode 550). The second input/output 740 is arranged between the second ESD absorber 770 and the external electrode (i.e., the second external electrode 520, the fourth external electrode 540, and the sixth external electrode 560).

When the ESD is input to the first input/output 730, the first ESD absorber 760 flows the input ESD to the ground 750 to block the ESD from being applied to the filter layer 200. When the ESD is input to the second input/output 740, the second ESD absorber 770 flows the input ESD to the ground 750 to block the ESD from being applied to the filter layer 200.

Referring to FIG. 20, the ESD absorption layer may configure the first input/output 730, the second input/output 740, and the ground 750 as a single plate-shaped conductor and may also be configured to stack the first ESD absorber 760 and the second ESD absorber 770 on the surface of the plate-shaped conductor.

Although the preferred exemplary embodiments of the present disclosure have been described above, it is understood that the present disclosure may be modified in various forms, and those skilled in the art may practice various modified examples and changed examples without departing from the scope of the claims of the present disclosure.

The invention claimed is:

1. A stacked common mode filter comprising:
  a filter layer formed with a plurality of coils;
  a lower magnetic layer arranged under the filter layer;
  an upper magnetic layer arranged above the filter layer; and
  an ESD absorption layer arranged in at least one of the lower magnetic layer and the upper magnetic layer.

2. The stacked common mode filter of claim 1,
  wherein the ESD absorption layer comprises: a lower ESD absorption layer interposed between the two magnetic sheets constituting the lower magnetic layer.

3. The stacked common mode filter of claim 2,
  wherein the lower magnetic layer comprises:
  a first magnetic sheet arranged under the filter layer; and
  a second magnetic sheet interposed between the filter layer and the first magnetic sheet, and
  wherein the lower ESD absorption layer is interposed between the first magnetic sheet and the second magnetic sheet.

4. The stacked common mode filter of claim 1,
  wherein the ESD absorption layer comprises: an upper ESD absorption layer interposed between the two magnetic sheets constituting the upper magnetic layer.

5. The stacked common mode filter of claim 4,
  wherein the upper magnetic layer comprises:
  a third magnetic sheet arranged above the filter layer; and
  a fourth magnetic sheet arranged above the third magnetic sheet, and
  wherein the upper ESD absorption layer is interposed between the third magnetic sheet and the fourth magnetic sheet.

6. The stacked common mode filter of claim 1,
  wherein the ESD absorption layer comprises:
  a first ESD absorber;
  a second ESD absorber spaced apart from the first ESD absorber; and
  a ground interposed between the first ESD absorber and the second ESD absorber.

7. The stacked common mode filter of claim 6,
  wherein the ESD absorption layer further comprises: a first input/output interposed between the first ESD absorber and an external electrode, and electrically connected to the first ESD absorber and the external electrode.

8. The stacked common mode filter of claim 7,
wherein the ESD absorption layer further comprises a second input/output interposed between the second ESD absorber and an external electrode, and electrically connected to the second ESD absorber and the external electrode.

9. The stacked common mode filter of claim 1,
wherein the ESD absorption layer comprises:
a plate-shaped conductor;
a first ESD absorber stacked on an upper surface of the plate-shaped conductor; and
a second ESD absorber stacked on the upper surface of the plate-shaped conductor and arranged to be spaced apart from the first ESD absorber.

10. The stacked common mode filter of claim 1,
wherein the filter layer has a plurality of nonmagnetic sheets formed with coil pattern stacked thereon.

11. The stacked common mode filter of claim 1,
wherein the filter layer comprises:
a plurality of nonmagnetic sheets stacked in a stacking direction;
a first coil formed on a laminate in which the plurality of nonmagnetic sheets are stacked;
a second coil formed on the laminate and independent of the first coil; and
a third coil formed on the laminate and independent of the first coil and the second coil.

12. The stacked common mode filter of claim 11,
wherein the first coil comprises a first coil pattern of a loop shape that winds a winding axis parallel to the stacking direction a plurality of times, the second coil comprises a second coil pattern of the loop shape that winds the winding axis the plurality of times, and the third coil comprises a third coil pattern of the loop shape that winds the winding axis the plurality of times.

13. The stacked common mode filter of claim 12,
wherein Nth and (N+1)th winding portions from an inner circumference of the second coil pattern in the direction of one side surface of the winding axis are arranged between Nth and (N+1)th winding portions from an inner circumference of the first coil pattern, and N is the odd number of 1 or more and equal to or less than the number of windings of the second coil pattern.

14. The stacked common mode filter of claim 13,
wherein Nth and (N+1)th winding portions from an inner circumference of the third coil pattern in the direction of one side surface of the winding axis each overlap the Nth and (N+1)th winding portions from the inner circumference of the first coil pattern,
wherein (M+1)th winding portions from the inner circumference of the third coil pattern in the direction of the other side surface of the winding axis each overlap Mth winding portions from the inner circumference of the first coil pattern, and wherein M is 1 or more and equal to or less than the number of windings of the third coil pattern.

15. The stacked common mode filter of claim 12,
wherein Nth and (N+1)th winding portions from an inner circumference of the second coil pattern in the direction of one side surface of the winding axis are arranged between Nth and (N+1)th winding portions from an inner circumference of the first coil pattern, and
wherein the Nth and (N+1)th winding portions from the inner circumference of the second coil pattern in the direction of the other side surface of the winding axis are arranged between (N+1)th and (N+2)th winding portions.

16. The stacked common mode filter of claim 15,
wherein Nth and (N+1)th winding portions from the inner circumference of the third coil pattern each overlap Nth and (N+1)th winding portions from the inner circumference of the first coil pattern.

17. The stacked common mode filter of claim 12,
wherein the first coil pattern, the second coil pattern, and the third coil pattern in the direction of one side surface of the winding axis are arranged so that portions having the same number of windings from the inner circumferences have the same separation distances from one another.

18. The stacked common mode filter of claim 17,
wherein an Xth winding portion from the inner circumference of the second coil pattern, an Xth winding portion from the inner circumference of the first coil pattern, and an (X+1)th winding portion from the inner circumference of the third coil pattern in the direction of the other side of the winding axis have the same separation distances from one another, and
wherein X is 1 or more and equal to or less than the number of windings of the second coil pattern.

19. The stacked common mode filter of claim 17,
wherein an Xth winding portion from the inner circumference of the second coil pattern and (X+1)th winding portions from the inner circumferences of the first coil pattern and the third coil pattern in the direction of the other side surface of the winding axis have the same separation distances from one another, and
wherein X is 1 or more and equal to or less than the number of windings of the second coil pattern.

20. The stacked common mode filter of claim 17,
wherein the first coil pattern, the second coil pattern, and the third coil pattern in the direction of the other side surface of the winding axis are arranged so that portions having the same number of windings from the inner circumferences have the same separation distances from one another.

* * * * *